United States Patent
Raszka et al.

(10) Patent No.: US 6,597,629 B1
(45) Date of Patent: Jul. 22, 2003

(54) BUILT-IN PRECISION SHUTDOWN APPARATUS FOR EFFECTUATING SELF-REFERENCED ACCESS TIMING SCHEME

(75) Inventors: Jaroslav Raszka, Fremont, CA (US); Rohit Pandey, New York, NY (US)

(73) Assignee: Virage Locic Corp., Fremont, CA (US)

( * ) Notice: Subject to any disclaimer, the term of this patent is extended or adjusted under 35 U.S.C. 154(b) by 0 days.

(21) Appl. No.: 10/223,499

(22) Filed: Aug. 19, 2002

Related U.S. Application Data (60) Provisional application No. 60/334,111, filed on Nov. 30, 2001.

(51) Int. Cl.[7] .................................................. G11C 8/18
(52) U.S. Cl. .................. 365/233; 365/210; 365/230.06; 365/194; 365/195; 365/191; 365/190; 365/154
(58) Field of Search .......................... 365/233, 230.06, 365/210, 193, 194, 195, 191, 154, 156, 190

(56) References Cited

U.S. PATENT DOCUMENTS

| | | | |
|---|---|---|---|
| 4,739,497 A | * | 4/1988 | Itoh et al. ............. 365/189.09 |
| 5,668,766 A | * | 9/1997 | Bramnik ..................... 365/207 |

* cited by examiner

*Primary Examiner*—Andrew Q. Tran
(74) *Attorney, Agent, or Firm*—Danamraj & Youst, P.C.

(57) ABSTRACT

Self-referenced, built-in access shutdown mechanism for a memory circuit. Instead of using a separate reference decoder/driver block and reference wordline path in the access timing loop, a wordline selected for accessing a core cell itself is utilized for referencing a shutdown sequence. A pair of complementary reference bitlines (BLS and BLE) are operable with a column of reference cells disposed in the row decoder. BLS/BLE control logic circuitry is operable to fine-tune the WL pulse width so as to minimize dead time and power consumption in access cycle operations.

31 Claims, 9 Drawing Sheets

BUILT-IN PRECISION SHUTDOWN APPARATUS FOR EFFECTUATING SELF-REFERENCED ACCESS TIMING SCHEME

PRIORITY UNDER 35 U.S.C. §119(e) & 37 C.F.R. §1.78

This nonprovisional application claims priority based upon the following prior United States provisional patent application entitled: ROW DECODER WITH PRECISION BUILT-IN SHUTDOWN, Application No.: 60/334,111, filed Nov. 30, 2001, in the name(s) of: Jaroslav Raszka, which is hereby incorporated by reference for all purposes.

BACKGROUND OF THE INVENTION

1. Technical Field of the Invention

The present invention relates generally to semiconductor memories. More particularly, and not by way of any limitation, the present invention is directed to a self-referenced memory access timing scheme using a built-in precision shutdown apparatus integrated within a memory row decoder.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that performance parameters such as access time, overall memory cycle time, power consumption, et cetera, play a pivotal role in designing a memory circuit, whether provided in an embedded SOC application or as a stand-alone device. These parameters can be critically dependent on the topology of a memory array. For high performance memories, accordingly, it is desirable that parameters such as access time, power consumption during access operations, and the like, are optimized regardless of the memory array sizes.

To achieve efficiency, access operations in most memories today are provided to be self-timed. That is, memory accesses typically require only a rising edge of an external clock signal, which is used to manufacture an internal memory clock that provides a time base for access operations. A shutdown signal is subsequently generated for effectuating access shutdown. Thus, in essence, a Self-Timed Clock (STCLK or STC) is imposed on the memory accesses.

Many techniques are available for effectuating the self-timed access clock in current memories. Regardless of the implementational variations, the basic concept remains the same: selecting a particular array wordline (WL) based on address signals specified for an access operation, monitoring array bitline(s) (BLs) to determine if they have discharged to a particular level, and turning off the WL at an appropriate time.

It should be appreciated that the conventional STC schemes are highly sensitive to the array sizes because the electrical characteristics—therefore, timing delays—are topology-dependent. As a consequence, while a specific self-timed access loop arrangement may be satisfactory with respect to a memory device of particular size and aspect, it may be entirely inadequate for other memory sizes. This deficiency is especially exacerbated in compilable memories which, by definition, are capable of generating numerous memory instances having different array sizes, aspect ratios, and I/O configurations, thereby necessitating different STC settings to optimize memory access operations.

In addition, more significantly, the current STC schemes in any implementation give rise to a significant area increase in the memory circuit's layout due to the necessity of the separate self-timed access loop components such as the reference decoder/driver block, RWL block, et cetera. Further, memory accesses timed with a conventional STC arrangement are beset with undesirable dead times, which not only impact access speed, but also give rise to a high amount of power consumption in the memory core due to the fact that the pulse width during which a selected wordline must be driven HIGH for effectuating the access operation is not optimized.

SUMMARY OF THE INVENTION

Accordingly, the present invention advantageously provides a self-referenced, built-in access shutdown mechanism preferably integrated within a row decoder of a memory circuit that obviates the need for separate circuitry and associated areas required for generating a self-timed clock. Instead of using a separate reference decoder/driver block and reference wordline path in the access timing loop, a wordline selected for accessing a core cell itself is utilized for referencing a shutdown sequence. A pair of complementary reference bitlines (BLS and BLE) are operable with a column of reference cells disposed in the row decoder. BLS/BLE control logic circuitry is operable to fine-tune the WL pulse width so as to minimize dead time and power consumption in access cycle operations.

In one aspect, the present invention is directed to a self-referenced timing system having a built-in shutdown apparatus for coordinating memory access operations. Wordline control circuitry is provided which includes an address decode block operable to generate a wordline start (WLS) signal, a reference cell portion for operating responsive to the WLS signal, a wordline generator block coupled to the reference cell portion for generating a wordline (WL) signal with respect to a memory access operation and a wordline shutdown feedback block operable to generate a wordline end (WLE) signal that feeds back to the reference cell portion. The reference cell portion, operating under a bitline start (BLS) control block and a bitline end (BLE) control, is used for controlling the timing loop of the memory access operation.

In another aspect, the present invention is directed to a self-referenced timing system for memory access operations, which includes circuitry for selecting a particular wordline in a memory circuit for an access operation, and circuitry for deselecting the particular wordline responsive to a shutdown feedback signal derived from the particular wordline.

In yet another aspect, the present invention is directed to a read access operation method in a memory circuit. Responsive to a clock signal provided to the memory circuit, a BLS control signal is generated. A selected WL in the memory circuit is activated based on a plurality of address signals. Thereafter, a self-referenced feedback control signal generated based on the WL signal is provided to a reference cell disposed in a row decoder of the memory circuit. Subsequently, a BLE control signal operable to drive the WL signal LOW is generated when a voltage level on the BLE control signal reaches a particular value.

In a still further aspect, the present invention is directed to a write access operation method in a memory circuit. As with the read access operations, responsive to a clock signal provided to the memory circuit, a BLS control signal associated with a reference cell disposed in a row decoder of the memory circuit is generated. Also, a bitline associated with a selected core cell is also driven LOW, but at a much faster rate than the rate of the BLS control signal. When the voltage level on BLS reaches the reference cell's write trip point, data stored therein is flipped. A selected WL is activated in the memory circuit based on a plurality of address signals when the voltage level on the selected bitline is at or substantially near zero. Responsive to the selected WL, data on the bitlines is written into the selected core cell's data nodes. Subsequently, a BLE control signal is generated which is operable to drive the WL signal LOW by flipping back the reference cell's data.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
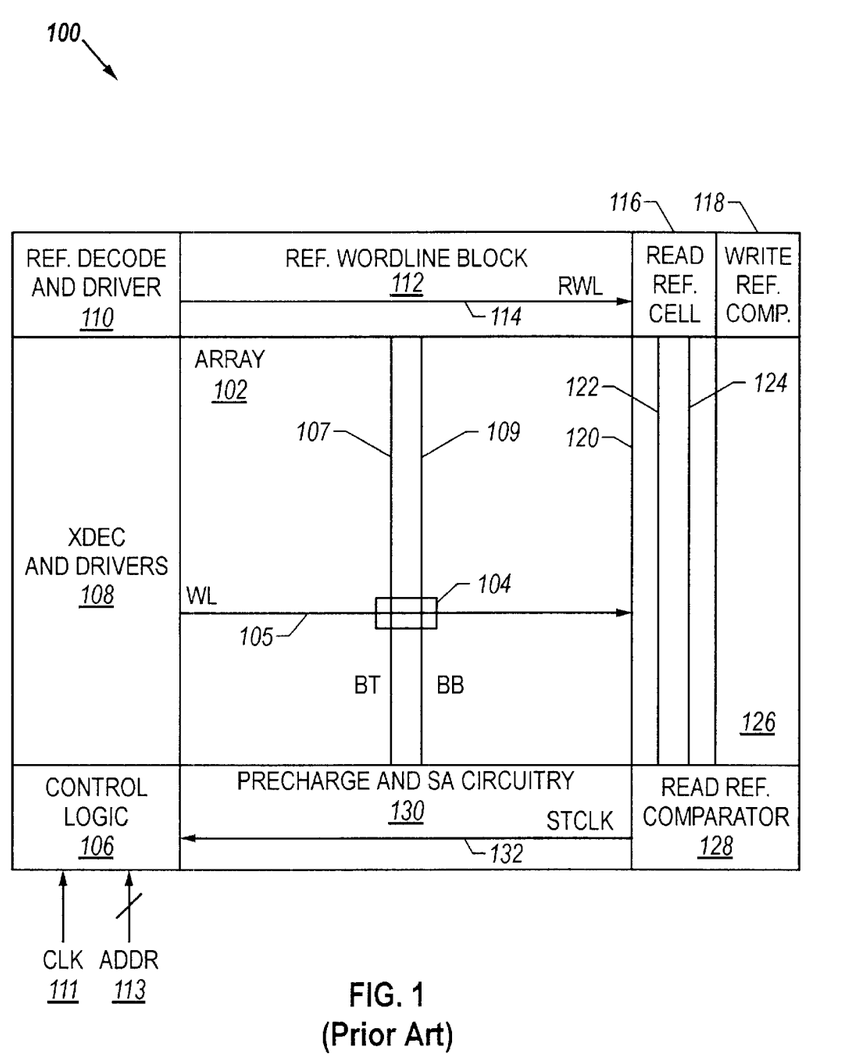
FIG. 1 (Prior Art) depicts a block diagram of an exemplary memory circuit with a conventional self-timed access scheme.

In the drawings, like or similar elements are designated with identical reference numerals throughout the several views thereof, and the various elements depicted are not necessarily drawn to scale. Referring now to FIG. 1, depicted therein is a block diagram of an exemplary embodiment of a memory circuit 100 having a conventional self-timed access scheme for effectuating read and write operations. The layout of the conventional memory circuit 100 includes a plurality of memory cells organized into an array 102, wherein reference numeral 104 refers to an exemplary core memory cell that can be accessed using the conventional access control scheme set forth below. A wordline (WL) 105 and a pair of complementary bitlines, BT 107 and BB 109, are associated with the core cell 104 in well known manner. A control logic block 106 operable responsive to a clock (CLK) signal 111 and a plurality of address signals 113, a precharge and sense amplifier (sense amp or SA) circuit block 130, and a row decoder (XDEC) block 108 having WL driver circuitry are also provided conventionally with respect to the array 102.

To facilitate the self-timed access control scheme, the conventional memory circuit 100 also includes the following components: a reference decoder and driver block 110 operable in conjunction with a reference WL (RWL) block 112 wherein. RWL 114 is exemplary, a read reference cell block.116, a read reference column block 120 having a pair of complementary reference bitlines (RBT 122 and RBB 124), a read reference comparator block 128, a write reference comparator block 118, and a write reference column block 126. As is well known, a self-timed clock (STCLK) signal 132 is provided from the reference comparator 128 to the control logic 106 to shut off the access cycle in the conventional scheme.

Figure 2:
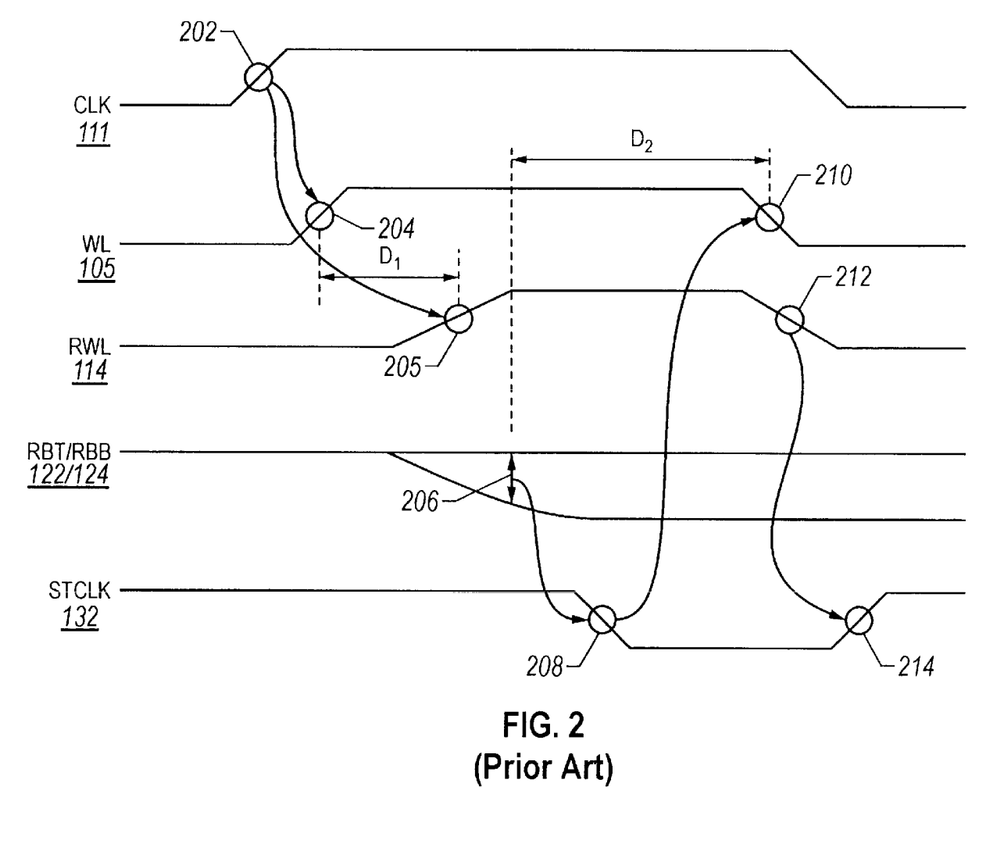
FIG. 2 (Prior Art) illustrates a timing diagram for a read access operation using the conventional scheme.

FIG. 2 depicts a timing diagram for a read access operation using the conventional self-timed scheme which illustrates some of the drawbacks and deficiencies associated therewith. Upon assertion of CLK 111, as exemplified by a rising edge 202 therein, selected WL 105 is driven HIGH. Reference numeral 204 refers to the rising edge of WL 105 generated responsive to the CLK signal. Thereafter, RWL 114 is also driven HIGH, but at a slower rate than the rate of selected WL because of the differences in the WL and RWL driver circuits. Reference numeral 205 refers to the rising edge in RWL 114, which is illustrated with a slope that is not as steep as the slope of WL's rising edge 204. Because the RWL signal starts later than the selected WL and due to the differences in the respective rising edge slopes, there is introduced at the outset a dead time D1 in the timing loop associated with the read cycle.

Continuing with the read access operation, responsive to the RWL's rising edge, the voltage levels of the reference BT and BB signal paths associated with a reference cell (preferably designed to mimic the selected core cell) are separated such that a voltage difference 206 (typically a few hundred millivolts) is developed therebetween. Depending on the sensitivity of the reference comparator circuitry, an access shutdown loop is initiated by a falling edge 208 created in STCLK 132 responsive to the voltage differential 206 between RBT 122 and RBB 124. Subsequently, the selected WL 210 is driven LOW (reference-numeral 210) responsive to the falling edge 208 of STCLK 132. Once again, a significant amount of dead time (D2) is introduced in the timing path because of the delay between the generation of the STCLK signal and the onset of WL shutdown. At any rate, before WL's shutdown, the voltage differential developed on the core cell's complementary bitlines (BT and BB, not shown in this FIG.) due to the data stored thereat is properly sensed by the SA circuitry 130 of the memory circuit 100. Thereafter, RWL 114 is driven LOW (reference numeral 212) and, responsive thereto, STCLK 132 is driven HIGH (reference numeral 214), completing the read cycle.

Although a conventional write access cycle is not particularly discussed herein, it is well known that the self-timed access control loop associated therewith is also afflicted with significant dead times similar to the read cycle's dead times described above. In addition to these dead times, which negatively impact the performance of a memory device, any implementation of the conventional self-timed access scheme gives rise to further disadvantages. For instance, as alluded to in the Background section of the present patent application, there is a significant area increase in the memory circuit's layout due to the necessity of the separate self-timed access loop components such as the reference decoder/driver block, RWL block, et cetera.

Figure 3:
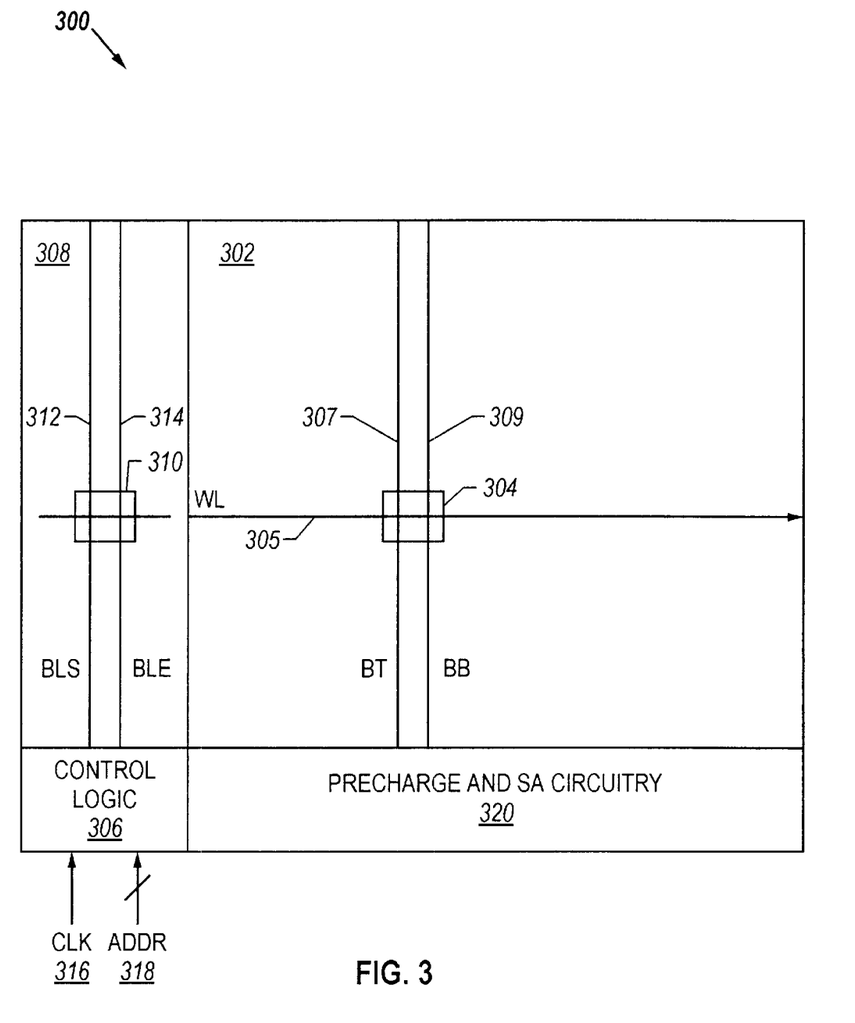
FIG. 3 depicts a block diagram of an exemplary memory circuit provided in accordance with the teachings of the present invention.

Referring now to FIG. 3, shown therein is a block schematic of an exemplary memory circuit 300 provided in accordance with the teachings of the present invention, wherein a self-referenced, built-in precision shutdown circuit apparatus is integrated within a row decoder 308 associated therewith. The memory circuit 300 includes a plurality of memory cells organized into an array 302, which may be architected in any known or heretofore unknown manner, e.g., vertical and horizontal banking, centrally-disposed XDEC in the array, et cetera. Reference numeral 304 refers to an exemplary core memory cell of the array 302, wherein WL 305 and complementary bitlines, BT 307 and BB 309, may be conventionally associated therewith. Also, the memory circuit 300 can be provided with precharge and SA circuitry 320 for effectuating memory operations in normal manner. A clock (CLK) signal 316, which can be a Bank Select signal or Bank Clock signal in a banked memory implementation, and a plurality of address signals 318 are provided to a control logic block 306 included in the memory circuit 300. In accordance with the teachings of the present invention, the control logic block 306 includes control circuitry, described in additional detail hereinbelow, to effectuate the self-referenced shutdown mechanism integrated within the row decoder block 308.

Essentially, instead of using a separate reference decoder/driver block and RWL path in the access timing loop, the present invention provides for an arrangement wherein a WL selected for accessing a core cell itself is utilized for referencing a shutdown sequence. A reference cell 310 disposed within XDEC block 308 along the WL selection path is activatable by a control signal manufactured from the selected WL. Further, a pair of complementary reference bitlines, Bitline_Start (BLS) 312 and Bitline_End (BLE) 314, associated with the reference memory cell 310 are controlled by reference bitline control circuitry disposed in the control logic block 306.

As will be seen in further detail below, the present invention's self-referenced access shutdown loop arrangement disposed within the row decoder circuitry not only obviates the need for separate areas required for the conventional self-timed access loop components, but the power consumption associated with access cycle operations is also advantageously reduced by precisely controlling the duration for which a selected WL needs to be driven HIGH. Relatedly, the access cycle time is also improved by eliminating the dead times associated with the conventional self-timed access scheme.

Figure 4:
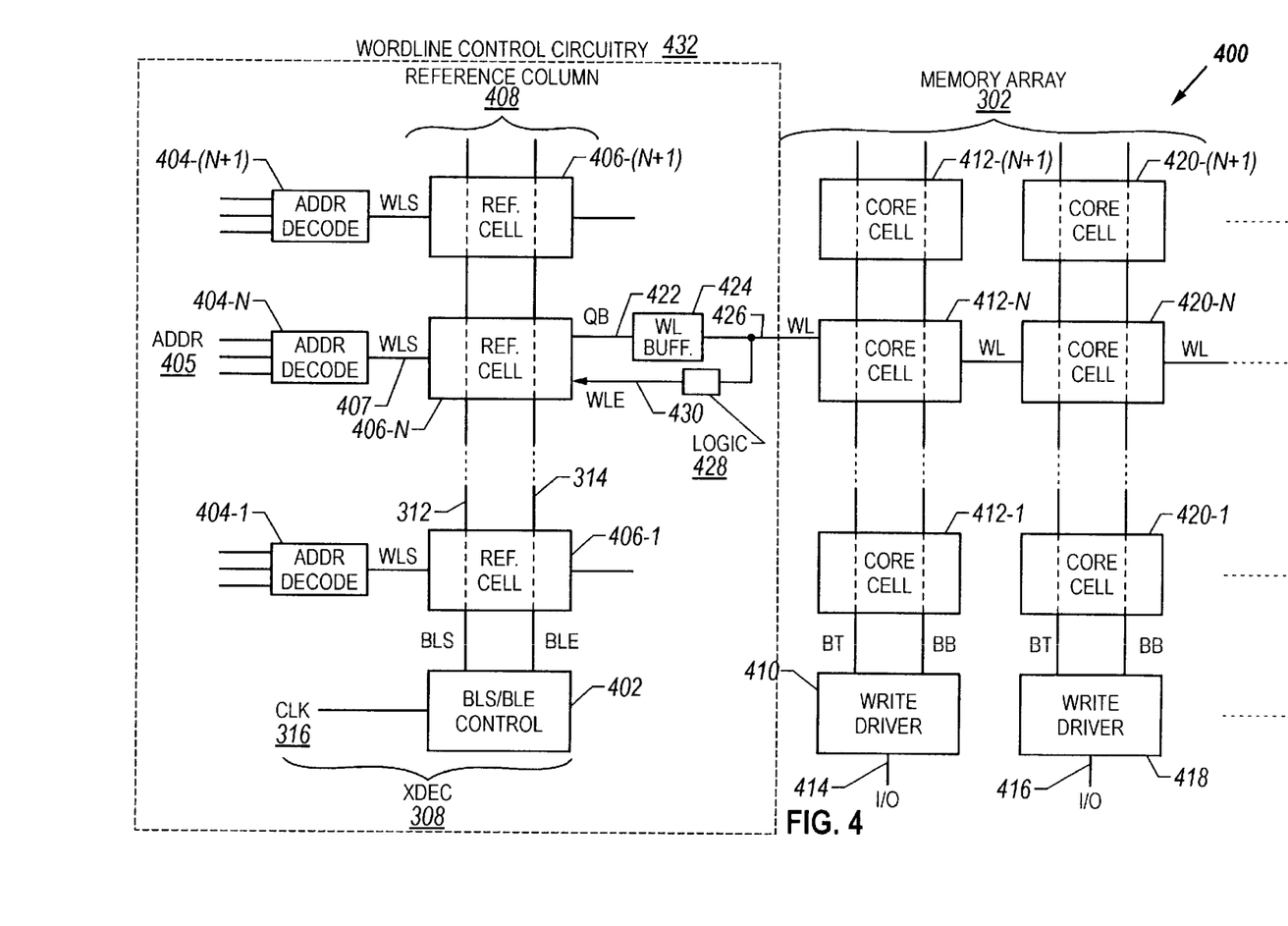
FIG. 4 depicts a block diagram of a portion of the exemplary memory circuit of the present invention wherein the row decoder is provided with a built-in precision shutdown apparatus for reducing power consumption during access operations.

FIG. 4 depicts a block diagram of a portion 400 of the exemplary memory circuit 300 of the present invention wherein the row decoder 308 is provided with a built-in precision shutdown apparatus for reducing power consumption during access operations. The memory array 302 is depicted as a plurality of columns comprising core cells, wherein reference numerals 412-1 through 412-(N+1) refer to core cells forming one exemplary column associated with I/O 414 and reference numerals 420-1 through 420-(N+1) refer to core cells forming another exemplary column associated with I/O 416. Each column of core cells is associated with a write driver to effectuate the write access operations. For instance, reference numerals 410 and 418 refer to the two write drivers associated with the two I/O columns 414 and 416, respectively. Also, each column of core cells is associated with the complementary BT and BB lines in conventional manner.

In a presently preferred exemplary embodiment of the present invention, a reference column 408 comprising a plurality of reference cells, reference numerals 406-1 through 406-(N+1), is disposed within XDEC 308. Associated with the reference column 408 is the pair of BLS 312 and BLE 314 signals for controlling the timing of the self-referenced access path in which a selected WL itself acts as a reference WL. A BLS/BLE control block 402 is operable responsive at least in part to CLK 316 in order to control the voltage levels on BLS 312 and BLE 314 for facilitating a fine-tuned regulation of a selected WL's pulse width pursuant to an access cycle operation.

In addition to the BLS/BLE control signals, each reference cell is operable responsive to a Wordline_Start (WLS) signal that is manufactured from a selected portion of row address signals by way of a decode circuit associated therewith. Accordingly, a plurality of decode circuits 404-1 through 404-(N+1) are disposed in XDEC 308, each operating to generate a WLS signal that is provided to the corresponding reference cell. By way of illustration, a selected portion of row address signals 405 are decoded by decode circuitry 404-N to generate WLS 407. Operating responsive thereto, reference cell 406-N generates a reference cell data signal, QB 422, which is buffered through a wordline buffer/generator 424 for driving selected WL 426 HIGH. In accordance with the teachings of the present invention, the selected WL 426 is looped back via appropriate logic 428 to generate a Wordline_End (WLE) signal 430 that is applied to the reference cell 406-N. As will be seen in greater detail hereinbelow, the operation of a reference cell in conjunction with BLS and BLE control signals and WLS/WLE signals provides a self-referenced access control scheme that is integrated within the row decoder 308 of the memory circuit.

It should be appreciated that although the embodiment depicted in FIG. 4 shows the reference cell column as part of the row decoder, it may be placed elsewhere in the memory circuit as long as the essential concept of "self-feedback" is implemented with respect to the selected WL for an access operation. In other words, at least a reference cell column may be provided as a column in the array itself, with the WL-based feedback provided separately for purpose of effectuating the self-referenced shutdown mechanism of the present invention.

Moreover, those skilled in the art will recognize that the address decode circuitry operable to generate WLS signals, reference cell column circuitry, WL generator circuitry (i.e., the WL buffer portion) and WL shutdown feedback block (i.e., the logic block) operable to generate WLE signals, can be treated together as wordline control circuitry 432 for purposes of effectuating self-referenced shutdown for access operations in accordance with the teachings of the present invention. Clearly, this circuitry includes circuit means to select a particular WL for an access operation and circuit means for deselecting that WL based on a feedback signal derived from the WL itself.

Figure 5:
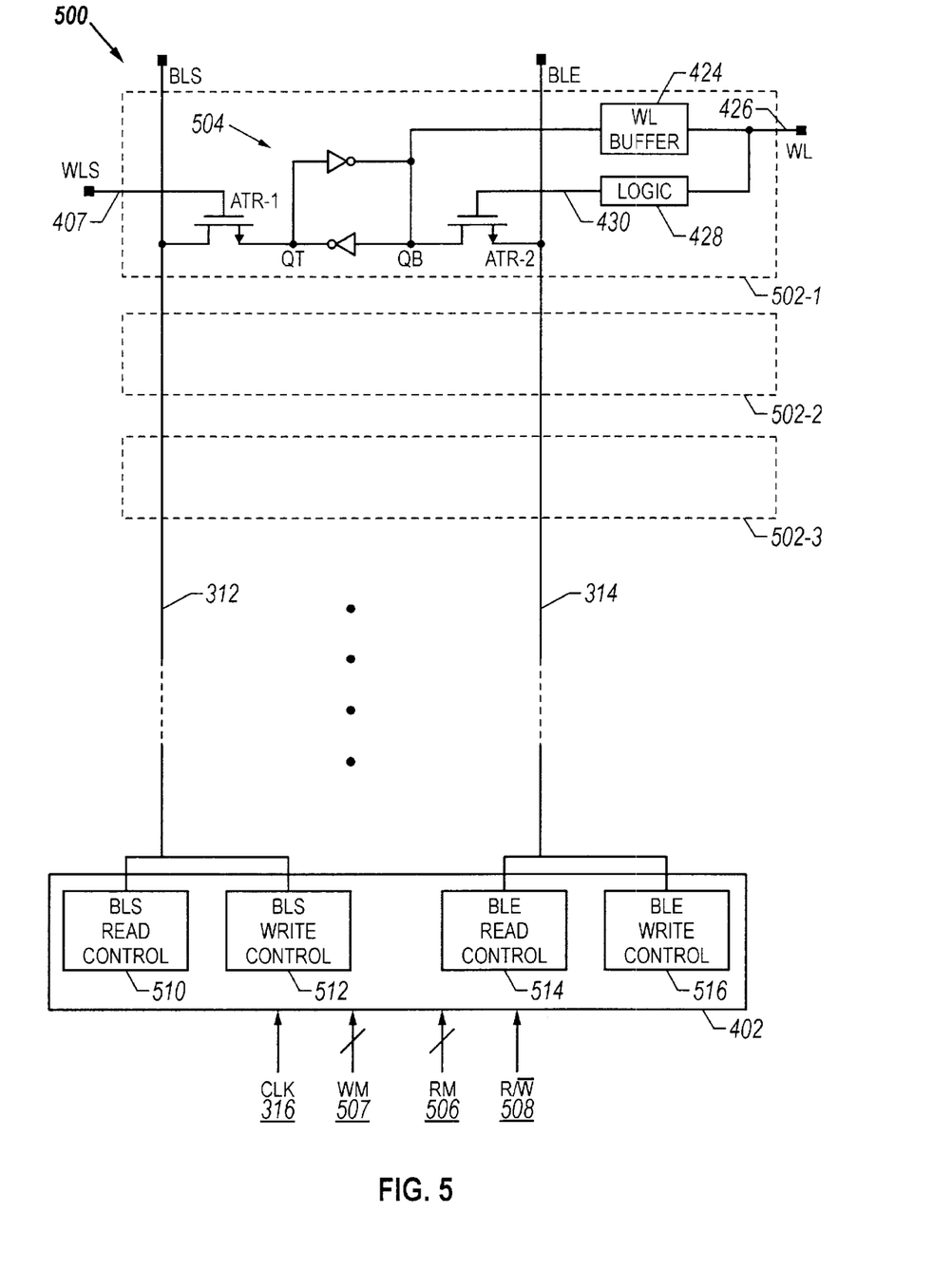
FIG. 5 depicts an exemplary embodiment of the built-in shutdown circuitry of the present invention.

Referring now to FIG. 5, depicted therein is an exemplary embodiment of the built-in access shutdown circuitry 500 of the present invention, which shows further details of an exemplary reference cell 504 and associated BLS/BLE control circuitry 402. At the outset, it should be recognized by those skilled in the art that the reference cell 504 is a particular exemplary implementation of the reference cells 406-1 through 406-(N+1) depicted in FIG. 4, wherein a cross-coupled latch is operable to support two data nodes, QT and QB, that are internal to it. Reference numerals 502-1 through 502-3 refer to three exemplary self-referenced access control circuitry portions, each of which corresponds to a WL of the memory array and includes a reference cell and associated driver/logic combination. Particularly referring to the exemplary reference cell 504, node QT is coupled to BLS 312 by means of a first access transistor ATR-1. Similarly, node QB is coupled to BLE 314 by means of a second access transistor ATR-2. In one implementation, these access transistors of the reference cell may be comprised of NMOS devices.

Again by way of illustration, WLS 407 is provided to the gate of access transistor ATR-1. Thus, when WLS 407 is driven HIGH, access transistor ATR-1 is in ON condition and node QT of the reference cell is pulled to the level present on BLS 312. The other data node, i.e., QB, will then be driven to the complementary level, which is propagated through the WL buffer circuitry 424 to appropriately drive the selected WL 426. In an exemplary implementation, the buffer circuitry 424 may comprise a number of suitably-sized inverters operable to drive the WL line to appropriate logic levels.

As pointed out earlier, the WL signal 426 is looped back via logic circuitry 428 to generate WLE 430 which drives the gate of the second access transistor ATR-2 of the exemplary reference cell. The number and sizes of the devices provided in the logic circuitry 428 can be selected with sufficient control such that the timing of the WLE signal can be fine-tuned. Again, similar to the case of the WLS signal, when WLE 430 is driven HIGH, the access transistor ATR-2 is turned ON and the QB node is pulled to the logic level present on the BLE signal 314.

The BLS/BLE control block 402 includes various logic circuits necessary to drive the BLS and BLE signals to different levels depending upon the access operation involved. A BLS read control block 510 and a BLE read control block 514 are operable to control read access operations. Similarly, a BLS write control block 512 and a BLE write control block 516 are operable to control write access operations. With respect to a read access operation, the BLS read control block 510 is operable to pull the BLS signal down at least substantially as soon as the CLK signal (or, the Bank Select signal, as the case may be) is asserted in order to initiate the read cycle. At the other end of the cycle, the BLE read control block 514 is operable to pull the BLE signal down by a current that is substantially about N times larger than the accessed core cell's read current. Additionally, the operation of the BLS and BLE read control blocks may be modulated by the use of one or more Read Margin (RM) control signals 506.

Regarding a write access operation, the BLS write control block 512 is operable to pull the BLS signal down by a device that mimics a write driver, but with a weaker drive. After the accessed core cell is flipped, the BLE signal is pulled down by the BLE write control block 516 in order to shut down the WL upon writing (i.e., storing new data). Similar to the read access modulation, the operation of the BLS and BLE write control blocks may be modulated during the write cycle by one or more Write Margin (WM) control signals 507. Additionally, a Read/Write control (R/W) signal 508 is provided to select whether a read cycle or a write cycle is to follow.

Figure 6:
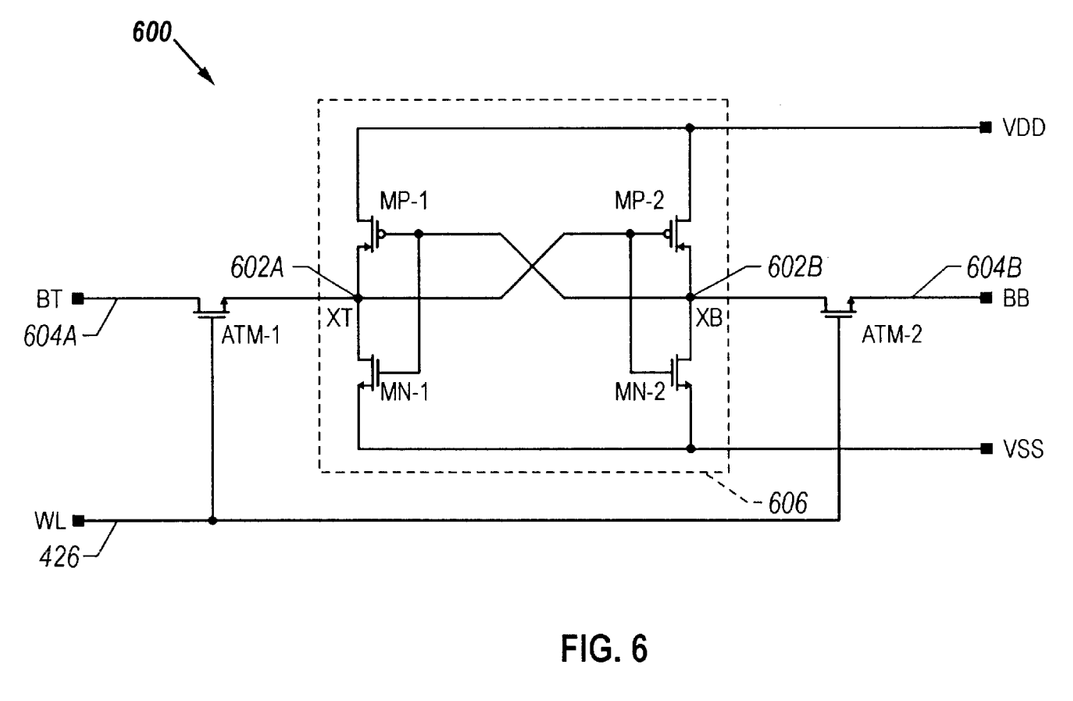
FIG. 6 depicts an exemplary core memory cell.

FIG. 6 depicts an exemplary core memory cell 600 coupled to a pair of complementary bitlines, BIT TRUE (BT) and BIT BAR (BB) (reference numerals 604A and 604B, respectively), associated with a selected column, which is illustrative of columns 414 and/or 416 shown in FIG. 4. Each of the complementary bitlines is coupled to appropriate precharge circuitry (not shown in this FIG.) such that it is pulled to a power supply rail or a reference voltage source (typically $V_{DD}$ or any portion thereof) when the precharge circuitry is activated.

The exemplary memory cell 600 is comprised of a cross-coupled CMOS latch 606. A first PMOS transistor MP-1 has the source/drain thereof connected between $V_{DD}$ and a first data node (XT) 602A, with the gate thereof connected to a second data node (XB) 602B, the data nodes 602A and 602B comprising the two complementary storage nodes in the memory cell 600. A first NMOS transistor MN-1 has the source/drain thereof connected between the data node 602A and a reference level, e.g., $V_{SS}$, with the gate thereof connected to the data node 602B. A second PMOS transistor MP-2 has the source/drain thereof connected between $V_{DD}$ and the data node 602B, with the gate thereof connected to the data node 602A. A second NMOS transistor MN-2 has the source/drain thereof connected between the data node 602B and $V_{SS}$ reference, and the gate thereof also connected to the data node 602A.

A first NMOS access transistor ATM-1 is disposed between BT 604A and the internal data node 602A, with the gate thereof coupled to a wordline (e.g., WL 426) associated with the memory cell 600. In similar fashion, a second NMOS access transistor ATM-2 has the source/drain thereof connected between BB 604B and the data node 602B, wherein the gate of the NMOS ATM-2 is driven by the wordline. The cross-coupled inverters of the memory cell form latch 606, where nodes XT and XB will always hold complementary full swing data values.

Initially, WL 426 is held LOW and the precharge circuitry associated with the bitlines is activated so as to equalize the bitline voltage level to a predetermined high voltage. Since the bitlines BT and BB run the entire length of a column of memory cells disposed in the memory array bank, there is a significant amount of capacitance associated with these bitlines. During a read operation, the precharge circuitry (not shown) is turned off and the wordline 426 is activated so as to turn on the access transistors ATM-1 and ATM-2. Accordingly, the data node XT 602A is coupled to BT 604A and the data node XB 602B is coupled to BB 604B. If, for example, a logic "0" was stored on the data node XT and a logic "1" was stored on the data node XB, transistor MN-1 would be turned ON and transistor MP-1 would be turned OFF. Thus, transistor MN-1 would pull BT 604A LOW, discharging the capacitance on the bitline.

Figure 7:
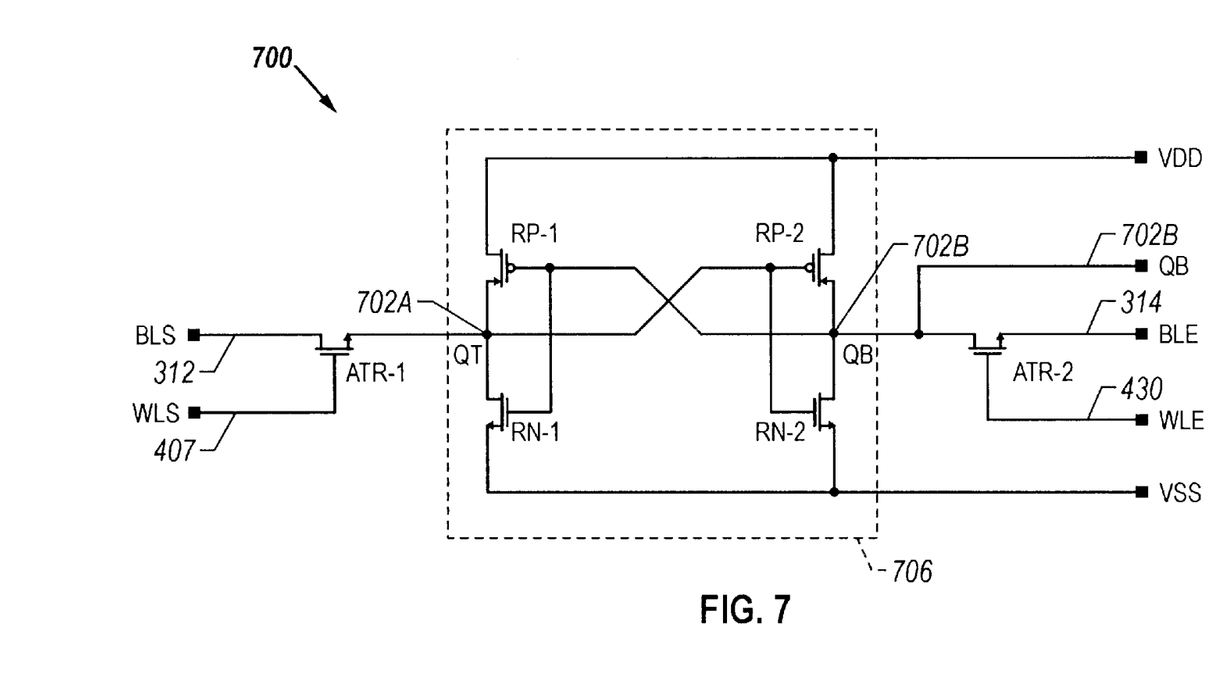
FIG. 7 depicts an exemplary reference cell provided in accordance with the teachings of the present invention as part of the built-in shutdown circuitry for low-power access operations.

FIG. 7 depicts an exemplary reference cell 700 provided in accordance with the teachings of the present invention as part of the self-referenced, precision built-in shutdown circuitry for low-power access operations, which reference cell is illustrative of reference cells 406-1 through 406-(N+1) shown in FIG. 4. Similar to the core cells, the reference cell 700 is comprised of a cross-coupled CMOS latch 706 operable to support two internal data nodes, QT 702A and QB 702B. Transistors RP-1 and RN-1 form one inverter and transistors RP-2 and RN-2 form the other inverter of the cross-coupled latch 706. As pointed out earlier, QT 702A is coupled to BLS 312 via ATR-1 that is gated by WLS 407 and QB 702B is coupled to BLE 314 via ATR-2 that is gated by WLE 430.

Figure 8:
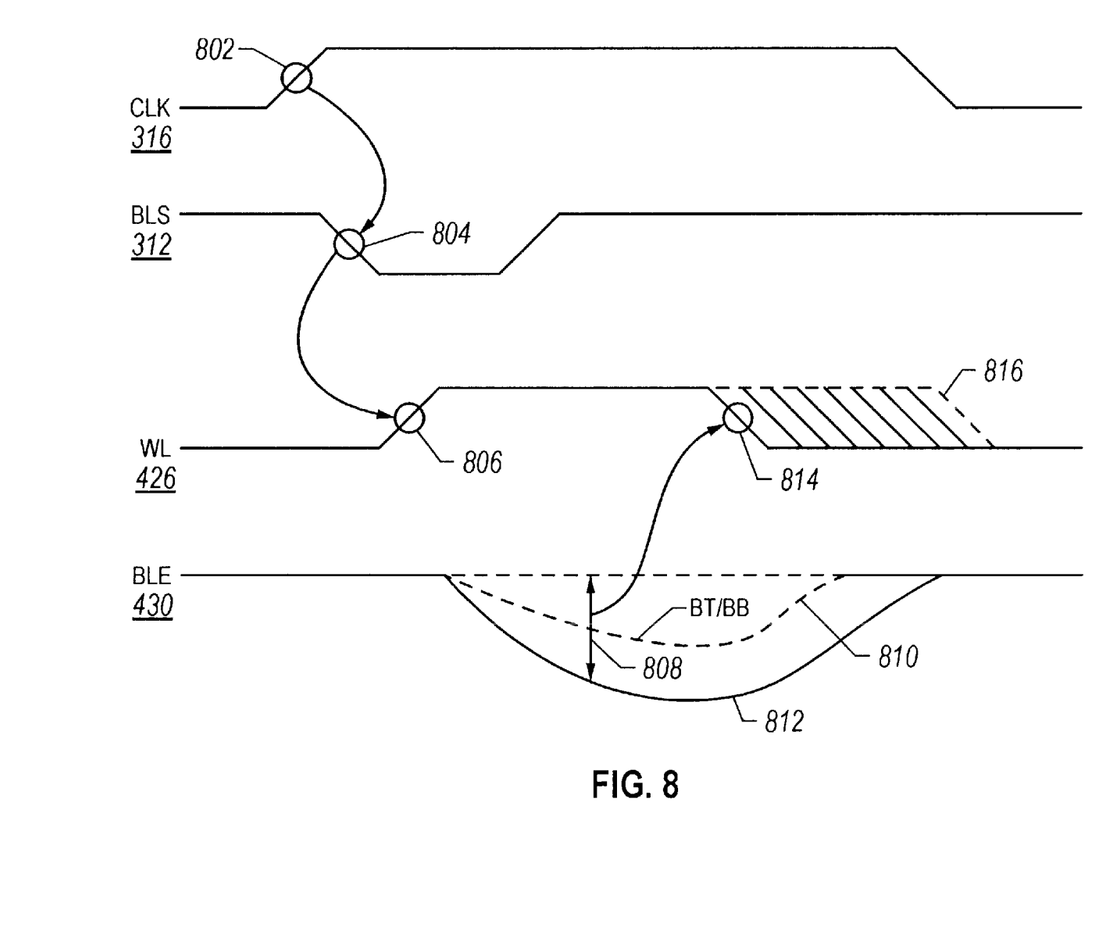
FIG. 8 illustrates a timing diagram for a read access operation using the built-in shutdown scheme of the present invention.

Referring now to FIG. 8, depicted therein is a timing diagram which illustrates a read access operation using the self-referenced built-in shutdown scheme of the present invention. Upon assertion of CLK 316 as indicated by a rising edge 802 therein, BLS 312 is pulled LOW by the BLS read control logic. Reference numeral 804 refers to the falling edge therein. Responsive thereto, WLS (not explicitly shown) and WL 426 are driven HIGH; reference numeral 806 refers to the rising edge of WL 426 that is generated based on the QB signal provided by the selected reference cell in the row decoder block. As pointed out earlier, BLE read control logic operates to drive BLE 430 LOW at a much faster rate, as illustrated by slope 812 therein, than the development of voltage differential on the BB/BT pair coupled to the accessed core cell. Reference numeral 810 refers to the shallow slope of the BB/BT pair which traces the voltage differential needed for accurate sensing. As the voltage BB/BT differential is developed, there is a substantial level on BLE 430, as indicated by $V_A$ 808, that triggers a shutdown of WL 426. Reference numeral 814 refers to the falling edge created for deselecting the wordline. Reference numeral 816 refers to the portion of WL being driven HIGH in the prior art memory access schemes, which indicates a wider WL pulse and hence more power consumption in the core. It should be appreciated by one of ordinary skill in the art that by controlling BLE logic, the required differential on the core bitlines can be precisely controlled, whereby WL pulse width may be modulated with accuracy.

Figure 9:
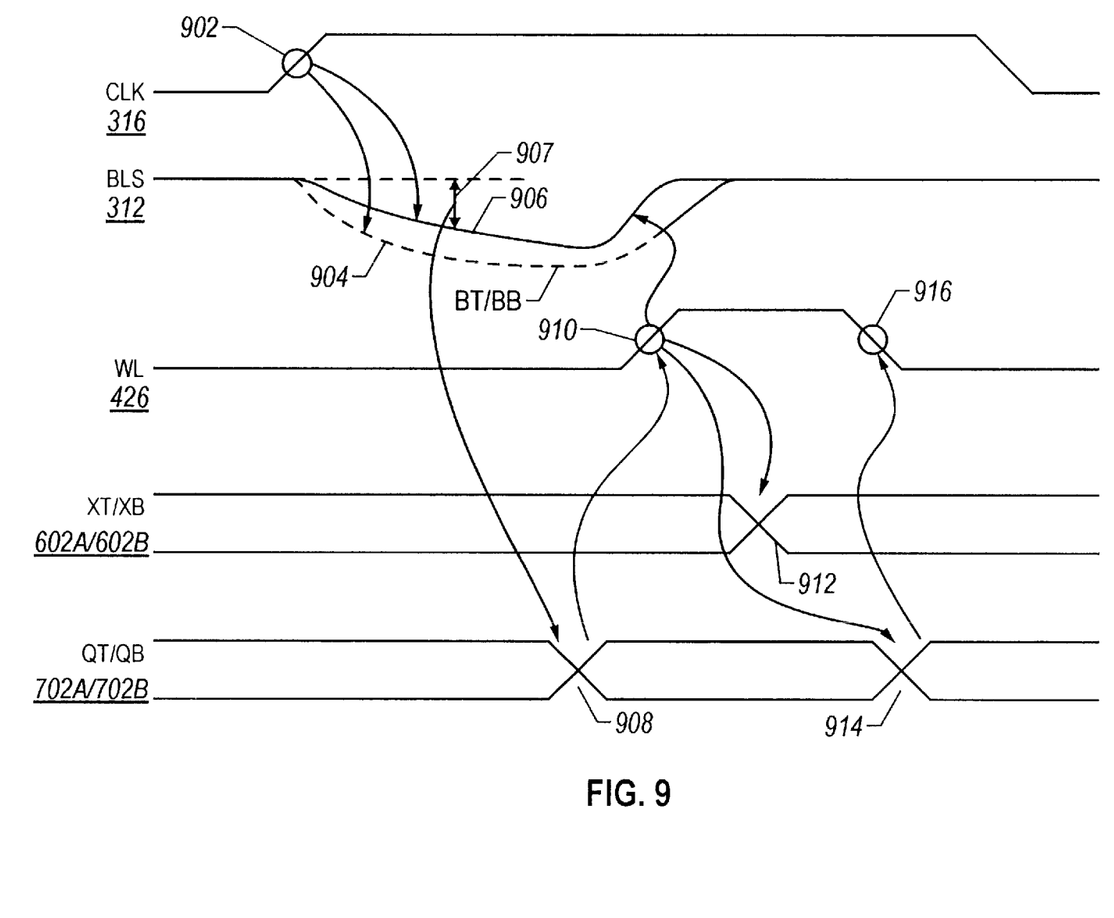
FIG. 9 illustrates a timing diagram for a write access operation using the built-in shutdown scheme of the present invention.

Referring now to FIG. 9, illustrated therein is a timing diagram for a write access operation using the built-in shutdown scheme of the present invention. As with the read access operation described hereinabove, CLK 316 (or, an appropriate control signal, e.g., a Bank Select or Bank Clock signal in a multi-bank memory) is asserted (indicated by rising edge 902) to start the access operation. Voltage levels of the core bitlines (BT and BB lines) are separated by pulling down the appropriate bitline depending upon the data value to be stored. Likewise, the voltage levels of the reference bitlines (i.e., BLE/BLS pair) are also separated by driving BLS 312 LOW. However, the BL separation is done at a much faster rate, as can be seen by the steeper slope 904 associated therewith. Reference numeral 906 refers to the shallow slope of the BLS drive. When the BLS voltage level 907 reaches the reference cell's write trip level, data on the internal nodes QT 702A and QB 702B of the reference cell is flipped as indicated by reference numeral 908. At this point, the voltage level on the pulled BL is substantially near zero and the selected WL 426 is driven HIGH. Reference numeral 910 refers to the rising edge therein, indicating the active status of WL 426. Responsive thereto, the core cell data nodes 602A/602B flip (as indicated by reference numeral 912), storing the data value thereat. Thereafter, the reference cell's nodes 702A/702B flip back as indicated by reference numeral 914. Associated with the reference cell nodes flipping back, BLE write control logic operates to pull BLE down (not shown), whereupon WL 426 is deactivated as indicated by its falling edge 916. In the meantime, BLS level is equalized and, subsequently, the write cycle is terminated.

It should be appreciated that power consumption in the access cycle effectuated by using the self-referenced scheme described above is minimized because the selected WL is driven HIGH only for the time period necessary to flip the core cell, thereby saving power in core bitline discharge (for columns that are not written to). Essentially, the WL is started only when the BT/BB paths in the core are completely separated (i.e., at or substantially near zero), and it is terminated as soon as the reference cell nodes flip back.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although SRAM-type memory has been particularly exemplified herein, the teachings of the present invention may be practiced in other memory types and architectures (e.g., EPROMs, Flash memories, etc.), either in compilable form or as standalone devices, where sense amp circuitry is utilized for data access operations. Additional types of memories including, e.g., register files, content addressable memories (CAMs), and the like, can also advantageously implement the self-referenced built-in shutdown scheme of the present invention. Further, the specific components and gates comprising the sense amp circuitry, precharge circuitry, BLS read/write control logic circuitry, BLE read/write control logic, WL buffer circuitry, etc. should be deemed to be only illustrative rather than limiting, as one of skilled in the art should readily recognize that identical or substantially similar logic functionality may be obtained by various device/gate implementations. Accordingly, all such modifications, substitutions, extensions, additions, combinations, et cetera, should be considered to be within the ambit of the present invention whose scope is limited solely by the claims appended hereinbelow.

What is claimed is:

1. A self-referenced timing system having a built-in shutdown mechanism for memory access operations, comprising:

wordline control circuitry further including an address decode block operable to generate a wordline start (WLS) signal, a reference cell portion for operating responsive to said WLS signal, a wordline generator block coupled to said reference cell portion for generating a wordline (WL) signal with respect to a memory access operation, and a wordline shutdown feedback block operable to generate a wordline end (WLE) signal that feeds back to said reference cell portion, wherein said reference cell portion is used for controlling the timing of said memory access operation.

2. The self-referenced timing system having a built-in shutdown mechanism for memory access operations as set forth in claim 1, wherein said reference cell portion is coupled to a bitline start (BLS) control circuit and a bitline end (BLE) control circuit, each operating to provide timing control with respect to said memory access operation.

3. The self-referenced timing system having a built-in shutdown mechanism for memory access operations as set forth in claim 2, wherein said BLS control circuit includes a BLS read control block.

4. The self-referenced timing system having a built-in shutdown mechanism for memory access operations as set forth in claim 3, wherein said BLS control circuit includes a BLS write control block.

5. The self-referenced timing system having a built-in shutdown mechanism for memory access operations as set forth in claim 4, wherein said BLE control circuit includes a BLE read control block.

6. The self-referenced timing system having a built-in shutdown mechanism for memory access operations as set forth in claim 5, wherein said BLE control circuit includes a BLE write control block.

7. The self-referenced timing system having a built-in shutdown mechanism for memory access operations as set forth in claim 2, wherein said reference cell portion is disposed within a row decoder of a memory circuit.

8. The self-referenced timing system having a built-in shutdown mechanism for memory access operations as set forth in claim 7, wherein said BLS control circuit and said BLE control circuit are integrated into a control logic block associated with said memory circuit.

9. The self-referenced timing system having a built-in shutdown mechanism for memory access operations as set forth in claim 1, wherein said reference cell portion includes a pair of cross-coupled inverters disposed between a pair of access transistors, said cross-coupled inverters operating to support a pair of QT and QB data nodes operable to be accessed by said access transistors.

10. The self-referenced timing system having a built-in shutdown mechanism for memory access operations as set forth in claim 9, wherein said QB node is operable to drive said wordline generator circuit coupled to said reference cell portion.

11. The self-referenced timing system having a built-in shutdown mechanism for memory access operations as set forth in claim 1, wherein said memory access operation is effectuated in a static random access memory (SRAM) device.

12. The self-referenced timing system having a built-in shutdown mechanism for memory access operations as set forth in claim 1, wherein said memory access operation is effectuated in an electrically programmable read-only memory (EPROM) device.

13. The self-referenced timing system having a built-in shutdown mechanism for memory access operations as set forth in claim 1, wherein said reference cell portion is disposed in proximity with said address decode block and said wordline generator block.

14. The self-referenced timing system having a built-in shutdown mechanism for memory access operations as set forth in claim 1, wherein said reference cell portion is provided for each WL of a memory circuit.

15. A self-referenced timing system for memory access operations, comprising:
means for selecting a particular wordline in a memory circuit for an access operation; and
means for deselecting said particular wordline responsive to a shutdown feedback signal derived from said particular wordline.

16. The self-referenced timing system for memory access operations as set forth in claim 15, wherein said means for selecting a particular wordline and means for deselecting said particular wordline operate in conjunction with a reference cell portion responsive to a wordline start (WLS) signal and a wordline end (WLE) signal generated thereby.

17. The self-referenced timing system for memory access operations as set forth in claim 16, wherein said reference cell portion is coupled to a bitline start (BLS) control circuit and a bitline end (BLE) control circuit, each operating to provide timing control with respect to said memory access operation.

18. The self-referenced timing system for memory access operations as set forth in claim 17, wherein said reference cell portion is disposed within a row decoder of said memory circuit.

19. The self-referenced timing system for memory access operations as set forth in claim 17, wherein said reference cell portion is disposed in an array portion of said memory circuit.

20. A self-referenced access timing methodology for memory access operations, comprising the steps:
selecting a particular wordline in a memory circuit for an access operation; and
deselecting said particular wordline responsive to a shutdown feedback signal derived from said particular wordline.

21. The self-referenced access timing methodology for memory access operations as set forth in claim 20, wherein said steps of selecting a particular wordline and deselecting said particular wordline are performed in conjunction with a reference cell responsive to a wordline start (WLS) signal generated by an address decode block and a wordline end (WLE) signal generated by a wordline shutdown feedback block.

22. The self-referenced access timing methodology for memory access operations as set forth in claim 21, further comprising the step of controlling said reference cell's timing based on a bitline start (BLS) signal and a bitline end (BLE) signal.

23. A read access operation method in a memory circuit, comprising the steps:
generating a bitline start (BLS) control signal responsive to a clock signal provided to said memory circuit;
activating a wordline (WL) in said memory circuit based on a plurality of address signals;
providing a feedback control signal generated based on said WL signal to a reference cell disposed in a row decoder of said memory circuit; and
generating a bitline end (BLE) control signal operable to drive said WL signal LOW when a voltage level on said BLE control signal reaches a particular value, wherein said BLS and BLE control signals are operable to be coupled to a pair of data nodes supported by said reference cell.

24. The read access operation method in a memory circuit as set forth in claim 23, wherein said plurality of address signals are decoded to a wordline start (WLS) signal which activates an access transistor operable to couple said BLS control signal to a first one of said data nodes.

25. The read access operation method in a memory circuit as set forth in claim 24, wherein said feedback control signal generated based on said WL signal activates an access transistor operable to couple said BLE control signal to a second one of said data nodes.

26. The read access operation method in a memory circuit as set forth in claim 25, wherein when said voltage level on said BLE control signal reaches said particular value, a voltage differential operable to trigger a sense amplifier circuit is developed on a pair of bitlines associated with an accessed core cell of said memory circuit.

27. A write access operation method in a memory circuit, comprising the steps:

generating a bitline start (BLS) control signal associated with a reference cell disposed in a row decoder of said memory circuit and driving a bitline pair associated with a selected core cell responsive to a clock signal provided to said memory circuit;

responsive to said BLS control signal, flipping data in said reference cell;

activating a wordline (WL) in said memory circuit based on a plurality of address signals;

responsive to said WL, writing data into said selected core cell based on voltage levels of said bitline pair; and generating a bitline end (BLE) control signal operable to drive said WL signal LOW by flipping back said reference cell's data, wherein said BLS and BLE control signals are operable to be coupled to a pair of data nodes supported by said reference cell.

28. The write access operation method in a memory circuit as set forth in claim 27, wherein said plurality of address signals are decoded to a wordline start (WLS) control signal which activates an access transistor operable to couple said BLS control signal to a first one of said data nodes.

29. The write access operation method in a memory circuit as set forth in claim 28, wherein a feedback control signal generated based on said WL signal activates an access transistor operable to couple said BLE control signal to a second one of said data nodes.

30. The write access operation method in a memory circuit as set forth in claim 29, wherein said BLE control signal is generated at a slower rate than said bitline pair's rate.

31. The write access operation method in a memory circuit as set forth in claim 30, wherein said WL is activated when one of said bitline pair is substantially at near zero potential.

* * * * *

UNITED STATES PATENT AND TRADEMARK OFFICE
CERTIFICATE OF CORRECTION

PATENT NO. : 6,597,629 B1
DATED : July 22, 2003
INVENTOR(S) : Raszka et al.

It is certified that error appears in the above-identified patent and that said Letters Patent is hereby corrected as shown below:

<u>Title page,</u>
Item [73], Assignee, "Locic" should read -- Logic --.

Signed and Sealed this

Thirtieth Day of December, 2003

JAMES E. ROGAN
*Director of the United States Patent and Trademark Office*